(12) United States Patent
Oh et al.

(10) Patent No.: US 6,951,785 B2
(45) Date of Patent: Oct. 4, 2005

(54) METHODS OF FORMING FIELD EFFECT TRANSISTORS INCLUDING RAISED SOURCE/DRAIN REGIONS

(75) Inventors: Chang-Woo Oh, Gyeonggi-do (KR); Dong-Gun Park, Gyeonggi-do (KR); Jeong-Dong Choe, Gyeonggi-do (KR); Chang-Sub Lee, Gyeonggi-do (KR)

(73) Assignee: Samsung Electronics Co., Ltd., Gyeonggi-Do (KR)

( * ) Notice: Subject to any disclaimer, the term of this patent is extended or adjusted under 35 U.S.C. 154(b) by 0 days.

(21) Appl. No.: 10/832,080

(22) Filed: Apr. 26, 2004

(65) Prior Publication Data

US 2004/0266081 A1 Dec. 30, 2004

(30) Foreign Application Priority Data

Jun. 25, 2003 (KR) ................. 10-2003-0041671

(51) Int. Cl.[7] .......................................... H01L 21/336
(52) U.S. Cl. .................. 438/197; 438/270; 438/299; 438/297; 438/424; 438/425; 438/289; 438/151
(58) Field of Search .............................. 438/197, 270, 438/299, 297, 151, 282, 589, 289, 424, 425

(56) References Cited

U.S. PATENT DOCUMENTS

| | | | | |
|---|---|---|---|---|
| 5,434,093 A | * | 7/1995 | Chau et al. ................. | 438/300 |
| 5,817,558 A | * | 10/1998 | Wu .............................. | 438/291 |
| 5,888,880 A | * | 3/1999 | Gardner et al. ............. | 438/424 |
| 5,899,719 A | | 5/1999 | Hong | |
| 5,923,980 A | * | 7/1999 | Gardner et al. ............. | 438/270 |
| 6,005,272 A | * | 12/1999 | Gardner et al. ............. | 257/344 |
| 6,054,355 A | * | 4/2000 | Inumiya et al. ............. | 438/296 |
| 6,093,947 A | | 7/2000 | Hanafi | |
| 6,100,146 A | * | 8/2000 | Gardner et al. ............. | 438/301 |
| 6,127,699 A | * | 10/2000 | Ni et al. ...................... | 257/330 |
| 6,319,776 B1 | * | 11/2001 | Tung ............................ | 438/270 |
| 6,642,130 B2 | * | 11/2003 | Park ............................ | 438/589 |
| 2004/0009644 A1 | * | 1/2004 | Suzuki ....................... | 438/270 |
| 2004/0089892 A1 | * | 5/2004 | Suzuki ....................... | 257/302 |

FOREIGN PATENT DOCUMENTS

| | | | | |
|---|---|---|---|---|
| JP | 2002-343963 | | 11/2002 | .......... H01L/29/78 |
| JP | 2002-353445 | | 12/2002 | .......... H01L/29/78 |
| KR | 1020000017149 | | 3/2000 | |
| KR | 10-0344733 | | 7/2002 | |

OTHER PUBLICATIONS

Notice to Submit Response, Korean Application No. 10–2002–0041671 Jan. 19, 2005, and English Translation thereof.

Stanley Wolf; "Silicon Processing for the VLSI ERA", vol. 2: Process Integration, Lattice Press (1990), pp. 158, and 298–367.

\* cited by examiner

*Primary Examiner*—David Zarneke
*Assistant Examiner*—Igwe U. Anya
(74) *Attorney, Agent, or Firm*—Myers Bigel Sibley & Sajovec

(57) ABSTRACT

A method of forming a field effect transistor may include forming a doped layer at a surface of a semiconductor substrate, and forming a groove through the doped layer at the surface of the semiconductor substrate while maintaining portions of the doped layer on opposite sides of the groove. A gate insulating layer may be formed on a surface of the groove, and a gate electrode may be formed on the gate insulating layer in the groove.

27 Claims, 10 Drawing Sheets

METHODS OF FORMING FIELD EFFECT TRANSISTORS INCLUDING RAISED SOURCE/DRAIN REGIONS

RELATED APPLICATION

The application claims the benefit of priority from Korean Application No. 2003-41671 filed Jun. 25, 2003, the disclosure of which is hereby incorporated herein in its entirety by reference.

FIELD OF THE INVENTION

The present invention relates to semiconductor memory devices and more specifically to methods of fabricating field effect transistors.

BACKGROUND OF THE INVENTION

Because metal-oxide-semiconductor field effect transistors (MOSFETs) provide relatively simple operation and high integration density, MOSFETs are widely used for digital electronic devices such as memory devices. A conventional MOSFET structure includes a gate electrode on a semiconductor substrate, source/drain impurity regions formed in the semiconductor substrate at opposite sides of the gate electrode, and a gate insulating layer between the semiconductor substrate and the gate electrode. Structures, operations, and fabrication of MOSFET devices are explained in "MOS Devices and NMOS process integration (chapter5)" of "Silicon Processing for the VLSI Era, Vol. 2-Process Integration," 2nd ed., Lattice Press: Sunset Beach Calif., 1986, by Stanley Wolf.

As described by Wolf, a conventional method of fabricating a MOSFET includes steps of sequentially forming a gate insulating layer and a gate electrode on a semiconductor substrate and performing an ion implantation using the gate electrode as a mask. The impurity regions formed by the ion implantation provide source and drain electrodes of the MOSFET. In addition, a thermal treatment may be performed during the ion implantation to cure lattice defects of the semiconductor substrate and to activate the implanted impurities. When the thermal treatment is performed for a long time however, implanted impurities may diffuse under the gate electrode resulting in a short channel effect such that a channel length of the MOSFET is reduced. Process variations of the thermal treatment, such as a temperature and/or a time, should be reduced to reduce short channel effects. Short channel effects may result, however, from a process sequence of forming the gate electrode before forming the source/drain regions. The short channel effect may thus occur even if the conditions of the thermal treatment are controlled.

As semiconductor devices become more highly integrated, there is a continuing need for source/drain electrodes having shallow junction structures. An elevated source/drain structure using an epitaxial growth technique has been proposed to form shallow junction structure, as disclosed at Page 158 of Wolf. However, the epitaxial growth technique may have technical disadvantages, such as complexity, high cost, and difficulty of control.

SUMMARY OF THE INVENTION

According to embodiments of the present invention, methods of forming a field effect transistor may include forming a doped layer at a surface of a semiconductor substrate and forming a groove through the doped layer at the surface of the semiconductor substrate while maintaining portions of the doped layer on opposite sides of the groove. A gate insulating layer is formed on a surface of the groove, and a gate electrode is formed on the gate insulating layer in the groove.

Before forming the groove, a mask may be formed on the doped layer wherein a gap in the mask exposes portions of the doped layer, and the groove may be formed by etching the exposed portions of the doped layer. More particularly, the mask may be formed by forming a layer of a mask material on the doped layer, and by patterning the layer of the mask material to expose portions of the doped layer. The mask material may be at least one of silicon oxide, silicon nitride, silicon oxynitride, and/or silicon carbide.

In addition, insulating spacers may be formed on sidewalls of the gap in the mask before forming the groove. The insulating spacers may be removed after forming the groove, the gate insulating layer, and the gate electrode, and doped regions may be formed in the groove adjacent the gate insulating layer after removing the insulating spacers. Moreover, removing the insulating spacers may include etching the spacers using an etch chemistry that etches the insulating spacers selectively with respect to the gate electrode, and the doped regions may be formed by ion implanting dopants having a same conductivity type as the doped layer. Forming the gate electrode may also include forming the gate electrode on the gate insulating layer in the groove and in the gap in the mask.

Isolation layers may also be formed on the surface of the semiconductor substrate defining an active region therebetween wherein the doped layer extends across an entirety of the active region prior to forming the groove. Moreover, forming the doped layer may include at least one of diffusing dopants into the doped layer, ion implanting dopants into the doped layer, and/or in-situ epitaxial growth of the doped layer. More particularly, forming the doped layer may include ion implanting dopants into the doped layer at a plurality of different energies, and the doped layer may have a relatively uniform dopant concentration throughout a depth thereof.

The groove may be formed by forming a mask on the doped layer wherein a gap in the mask exposes portions of the doped layer, and by recessing exposed portions of the doped layer to a depth less than a depth of the doped layer. After removing exposed portions of the doped layer to a depth less than a depth of the doped layer, insulating spacers may be formed on sidewalls of the gap in the mask and on sidewalls of the recessed portions of the doped layer, and after forming the insulating spacers, portions of the doped layer between the insulating spacers may be etched. Moreover, the exposed portions of the doped layer may be recessed to a depth of greatest dopant concentration.

In an alternative, the groove may be formed by forming a mask on the doped layer wherein a gap in the mask exposes portions of the doped layer, and etching through exposed portions of the doped layer. After etching through exposed portions of the doped layer, a lightly doped region may be formed in the substrate exposed through the mask, and insulating spacers may be formed on sidewalls of a gap in the mask and on sidewalls of the doped layer. Portions of the lightly doped region exposed through the mask and spacers may then be etched.

Before forming the gate insulating layer, a doped channel region may be formed in a portion of the substrate exposed through the groove. Moreover, portions of the semiconductor substrate adjacent the doped layer may have a conductivity type different than a conductivity type of the doped layer, and the portions of the semiconductor substrate adjacent the doped layer may have a conductivity type that is the same as a conductivity type of the doped channel region. Forming the doped channel region may include at least one of diffusing dopants into the doped channel region, ion implanting dopants into the doped channel region, and/or in-situ epitaxial growth of the doped channel region. In addition, the gate insulating layer may be formed by thermally oxidizing a surface of the groove at a temperature in the range of approximately 700° C. to approximately 1200° C.

A mask may also be formed on the doped layer before forming the groove such that a gap in the mask exposes portions of the doped layer, and the groove may be formed by etching the exposed portions of the doped layer. Moreover, the gate electrode may be formed by forming a conductive layer on the mask, in the gap in the mask, and on the exposed portions of the doped layer, and portions of the conductive layer on the mask may be removed while maintaining portions of the conductive layer in the gap and on the exposed portions of the doped layer. The conductive layer may include at least one of polysilicon, polysilicon germanium, tungsten, cobalt, titanium, titanium nitride, tantalum, tantalum nitride, aluminum, and/or copper. In addition, the mask may be removed after removing portions of the conductive layer on the mask. A doped channel region may also be formed at a surface of the semiconductor substrate before forming the doped layer, and forming the doped layer may include forming the doped layer on the doped channel region. Moreover, forming the doped layer may include forming the doped layer using epitaxial deposition on the doped channel region.

In another alternative, an active region mask may be formed on portions of the doped layer after forming the doped layer, and device isolation trenches may be formed in portions of the doped layer and semiconductor substrate exposed by the active region mask. Isolating layers may then be formed in the device isolation trenches. In addition, a gap may be formed in the active region mask exposing portions of the doped layer between isolating layers, and the groove may be formed by etching portions of the doped layer exposed through the gap in the mask.

According to additional embodiments of the present invention, a field effect transistor includes a semiconductor substrate having first and second raised source/drain regions wherein the first and second raised source/drain regions are separated by a gap therebetween. A gate insulating layer is on the semiconductor substrate in the gap between the first and second raised source/drain regions, and a gate electrode is on the gate insulating layer so that the gate insulating layer is between the gate electrode and the semiconductor substrate.

The field effect transistor may also include device isolation trenches in the semiconductor substrate, and device isolation layers in the device isolation trenches. More particularly, the device isolation trenches may surround an active region of the semiconductor substrate including the first and second raised source/drain regions and the gap. In addition, the field effect transistor may include an insulating layer on the first and second raised source/drain regions and on the gate electrode, and the insulating layer may include contact holes therein respectively exposing the first and second raised source/drain regions and the gate electrode. Moreover, contact plugs may be provided in the respective contact holes exposing the first and second raised source/drain regions and the gate electrode.

A doped channel region may also be included in the semiconductor substrate adjacent the gap between the first and second raised source/drain regions. Moreover, the doped channel region may have a conductivity type different than a conductivity type of the first and second raised source/drain regions. In addition, the doped channel region may extend beyond the gap adjacent the first and second raised source/drain regions.

Embodiments of the present invention may provide methods of fabricating MOS field effect transistors capable of reducing short channel effects. Other embodiments of the present invention may provide methods of fabricating MOS field effect transistors having thin junction structures.

In some embodiments of the present invention, methods of fabricating MOS field effect transistors may include forming an impurity layer in an entire surface of an active region. The impurity layer may be used as a source/drain electrode before a gate electrode is formed. An impurity layer and mask patterns exposing predetermined regions of the impurity layer are sequentially formed on a semiconductor substrate. The exposed impurity layer is etched to form a groove. Then, a gate insulating layer is formed on the exposed surface of the groove and a gate conductive pattern is formed, which fills a gap region including the groove having the gate insulating layer and a space between the mask patterns.

In some embodiment of the present invention, a device isolating layer may be further formed to define a plurality of active regions in the semiconductor substrate before the impurity layer is formed. In this case, the impurity layer may be formed on an entire surface of the predetermined active region.

In addition, forming the impurity layer may include at least one of diffusion, ion implantation, and/or in-situ epitaxial growth. The impurity layer may have an impurity concentration uniform through a depth of the impurity layer. For this, forming the impurity layer may use a plurality of ion implantation steps having different ion energies.

The step of forming of the mask patterns may include forming a mask layer on the impurity layer. Then, the mask layer may be patterned to expose predetermined regions of the impurity layer. The exposed region of the impurity layer is the region where the gate conductive pattern is disposed. The mask layer may be formed of one selected from silicon oxide, silicon nitride, silicon oxynitride, and/or silicon carbide.

In some embodiments of the present invention, spacers may be formed on sidewalls of the mask patterns before forming the gate insulating layer. After the gate conductive pattern is formed, the spacers may be removed. In this case, an extended impurity region may be formed in the semiconductor substrate under the removed spacers. The step of removing may include an etch process using an etch recipe having an etch selectivity with respect to the gate conductive pattern, and the step of forming the extended impurity region may include an ion implant for implanting impurities of the same conductivity type as the impurity layer.

In some embodiments of the present invention, the step of forming the groove may include recessing the impurity layer to a predetermined depth using the mask patterns as an etch mask, and forming spacers disposed on both sidewalls of the mask patterns on the recessed impurity layer. Then, the impurity layer exposed between the spacers may be etched using the spacers and the mask patterns as an etch mask. In this case, the step of recessing the impurity layer may etch the impurity layer to a depth where the impurity concentration is highest.

In some embodiments of the present invention, a channel impurity region may be further formed in the semiconductor substrate before the gate insulating layer is formed. The semiconductor substrate and the impurity region may have different conductivity types. However, the semiconductor substrate and the channel impurity region may have the same conductivity type. In addition, the channel impurity region may be formed using at least one of diffusion, ion implantation, and/or in-situ epitaxial growth techniques. Forming the gate insulating layer may include a thermal oxidation process performed at a temperature in the range of approximately 700° C. to approximately 1200° C.

The step of forming the gate conductive pattern may include forming a gate conductive layer on the semiconductor substrate including the gate insulating layer to fill the gap region. The gate conductive layer may then be planarizingly etched to expose the mask patterns. In addition, according to other embodiments of the present invention, the exposed mask patterns may be removed after the gate conductive layer is planarizingly etched.

In some embodiments of the present invention, the channel impurity region may be formed in the semiconductor substrate under the groove. In other embodiments of the present invention, the channel impurity region may be formed on an entire surface of a predetermined region of the semiconductor substrate before forming the impurity layer. In this case, the step of forming the impurity region may include growing an epitaxial layer on the channel impurity region.

In further embodiments of the present invention, a device isolating layer may be further formed before the impurity layer is formed. That is, a device isolating mask layer may be formed to cover the impurity layer, and patterned to form device isolating mask patterns exposing predetermined regions of the impurity layer. The exposed impurity layer, the channel impurity layer and the semiconductor substrate may be successively etched (using the device isolating mask patterns as an etch mask) to form a device isolating trench defining active regions. Then, a device isolating layer may be formed to fill the device isolating trench. The step of forming the mask patterns may include patterning the device isolating mask patterns to expose predetermined regions of the impurity layer. The exposed region of the impurity layer is the region where the gate conductive pattern is disposed.

DETAILED DESCRIPTION

Figure 1:
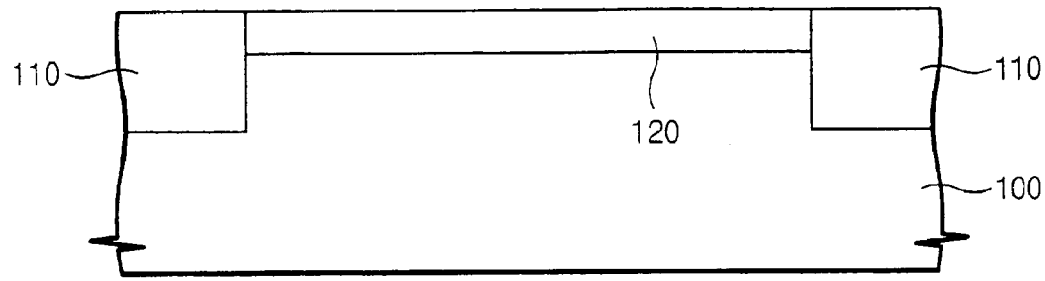
FIGS. 1 through 7 are cross-sectional views illustrating intermediate structures of fabricating MOS field effect transistors (MOSFETs) according to embodiments of the present invention.

The present invention will now be described more fully with reference to the accompanying drawings, in which embodiments of the invention are shown. This invention may, however, be embodied in many different forms and should not be construed as being limited to the embodiments set forth herein; rather, these embodiments are provided so that this disclosure will be thorough and complete, and will fully convey the concept of the invention to those skilled in the art. In the drawings, the size and the thickness of layers and regions are exaggerated for clarity. It will also be understood that when an element such as a layer, region, or substrate is referred to as being on another element, it can be directly on the other element, or intervening elements may also be present. Like numbers refer to like elements throughout.

It will also be understood that when an element is referred to as being connected to or coupled to another element, it can be directly connected to or coupled to the other element, or intervening elements may also be present. Furthermore, relative terms such as beneath may be used herein to describe one layer or regions relationship to another layer or region as illustrated in the Figures. It will be understood that these terms are intended to encompass different orientations of the device in addition to the orientation depicted in the Figures. For example, if the device in the Figures is turned over, layers or regions described as beneath other layers or regions would now be oriented above these other layers or regions. The term beneath is intended to encompass both above and beneath in this situation. It will also be understood that although the terms first and second may be used herein to describe various regions, layers and/or sections, these regions, layers and/or sections should not be limited by these terms. These terms are only used to distinguish one region, layer or section from another region, layer or section. Thus, a first region, layer or section discussed below could be termed a second region, layer or section, and similarly, a second region, layer or section may be termed a first region, layer or section without departing from the teachings of the present invention. As used herein, the terms "impurity layer" and "doped layer" and the terms "impurity" and "dopant" are used interchangeably.

FIGS. 1 through 7 are cross-sectional views illustrating a method of fabricating a MOS field effect transistor (MOSFET) according to a embodiments of the present invention. Referring to FIG. 1, a device isolating layer 110 is formed in predetermined regions of a semiconductor substrate 100. The semiconductor substrate 100 may be divided into a plurality of subregions including a first sub-region and a second sub-region. In this case, a plurality of active regions may be arranged at each of the subregions.

The first and second sub-regions may be defined as subregions where NMOSFETs and PMOSTETs are respectively disposed. That is, the subregions may be divided on the basis of a conductivity type of transistors disposed in each subregion, but various different criteria can be used for this classification of subregion. To reduce repeated explanations, a specific subregion will be focused herein. Structures including regions having opposite conductivity types are included within the scope of the present invention.

An impurity layer 120 (also referred to as a doped layer or doped regions) is formed in the semiconductor substrate 100 having the device isolating layer 110. Preferably, the impurity layer 120 has a conductivity type different from that of the semiconductor substrate 100 and is formed in the entire active regions included in a predetermine subregion. The impurity layer 120 may be formed using at least one of ion implantation, diffusion, and/or in-situ epitaxial growth.

For a convenience of subsequent etching processes, an impurity concentration of the impurity layer 120 may be relatively uniform regardless of a depth. Forming the impurity region 120 may include a plurality of ion implants using different conditions of ion energy.

To cure crystalline defects occurring during the formation of the impurity layer 120 and to activate impurities therein, a thermal treatment may be performed at a temperature in the range of approximately 700° C. to approximately 1200° C. According to the prior art, process conditions of the thermal treatment (such as time and/or temperature) may be limited. The limitations may reduce an excessive diffusion of impurities in a source/drain region and a short channel effect caused thereby.

Figure 3:
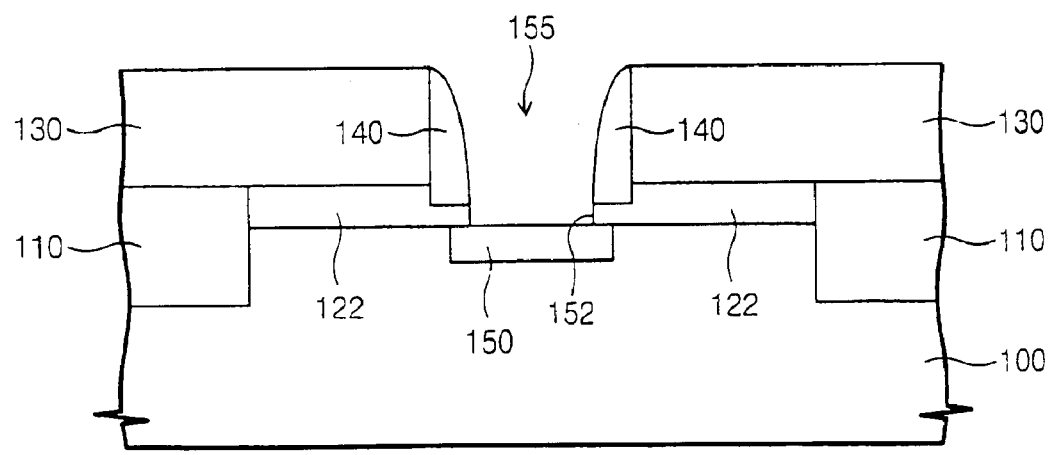

According to embodiments of the present invention, the impurity layer 120 may be divided into a source impurity region and a drain impurity region using a subsequent damascene gate process (referring to 122 of FIG. 3). That is, the impurity layer 120 may be used to form source/drain electrodes prior to a forming of the gate electrode. In addition, the impurity layer 120 may be formed on an entire surface of the active region, so that a short channel effect may be reduced.

Figure 2:
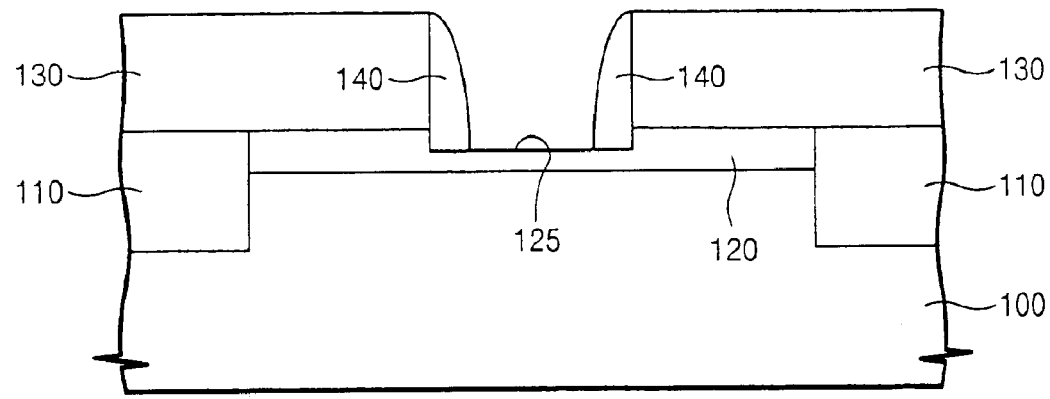

Referring to FIG. 2, a mask layer is formed on the semiconductor substrate 100 including the impurity layer 120, and the mask layer is patterned to form mask patterns 130 exposing predetermined regions of the impurity layer 120. The exposed region of the impurity layer 120 is the region where a gate conductive pattern will be formed by subsequent processes. That is, the mask patterns 130 can be used to form the gate conductive pattern. Moreover, the mask layer may be selected from at least one of a silicon nitride layer, a silicon oxynitride layer, a silicon oxide layer, a silicon carbide layer, and/or a polysilicon layer.

Meanwhile, according to an alternative, the mask layer may be formed of polysilicon having a high concentration of impurities, and the impurity layer 120 may be formed without ion implantation as discussed above with respect to FIG. 1. The impurity layer 120 may instead be formed by means of diffusion of impurities from the polysilicon mask layer.

The exposed portions of the impurity layer 120 are etched to a predetermined depth using the mask patterns 130 as an etch mask to form a recessed region. The recessed region may be formed by overetching the mask patterns 130 and/or using an additional etch process. In this case, the recessed region may have a highest impurity concentration of the impurity layer 120 at a top surface 125 of the recessed region. In this case, an electrical resistance between the source/drain electrodes can be reduced because the source/drain electrodes can be formed to have a high impurity concentration. As illustrated in FIG. 1, a difficulty of controlling the etch depth accurately during a formation of the recessed region may be reduced if the impurity concentration of the impurity layer 120 is uniform along a depth thereof.

The spacers 140 are formed on sidewalls of the mask patterns 130. The spacers 140 are disposed on a top surface 125 of the recessed region and may be formed of materials having an etch selectivity with respect to the mask patterns 130 and the impurity layer 120. According to embodiments of the present invention, the mask patterns 130 may be silicon oxide/silicon nitride layers that are sequentially stacked, and the spacers 140 may be silicon oxide. According to further embodiments of the present invention, the spacers 140 may be a high-k dielectric material.

Referring to FIG. 3, the recessed region of the impurity layer 120 may be further etched using the spacers 140 and the mask patterns 130 as an etch mask. The etch process may be performed to expose the semiconductor substrate 100 as shown in FIG. 3. Therefore, grooves 152 may be formed between the spacers 140, dividing the impurity layer 120 into two parts. The divided impurity layer 120 may thus provide a source/drain impurity regions 122 serving as source/drain electrodes of a MOSFET. The space defined by the groove 152 and the spacers 140 is a gap region 155 (where a gate conductive pattern will be disposed in a subsequent process). That is, the gap region 155 may be surrounded by the spacers 140 and the source/drain impurity regions 122.

A channel impurity region 150 is formed in the top surface of the exposed substrate 100 under the gap region 155. The channel impurity region 150 may serve as a channel of the MOSFET, and the groove 152 may be formed using an etch method capable of reducing etch damage of the semiconductor substrate 100. The step of forming the channel impurity region 150 may use at least one of ion implantation, diffusion, and/or in-situ epitaxial growth. In-situ epitaxial growth may be used if over etch occurs when forming the groove 152. The channel impurity region 150 may include impurities having the same conductivity type as the semiconductor substrate 100.

Figure 8:
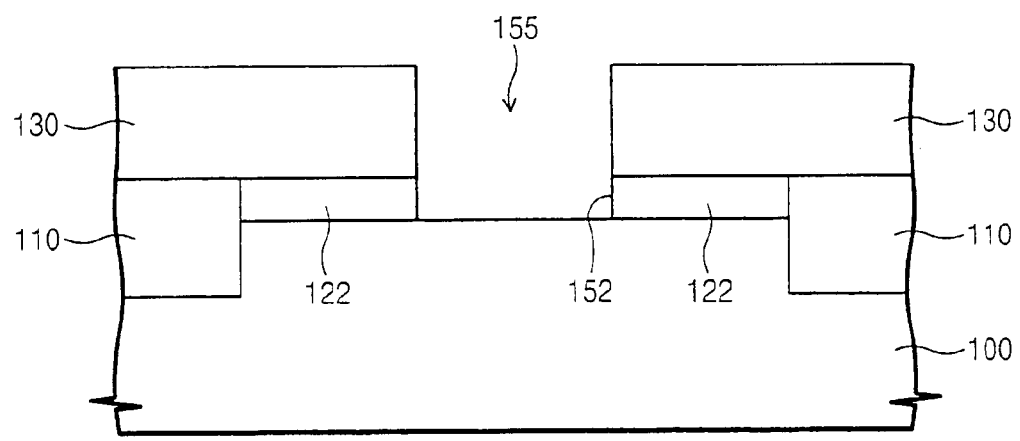
FIGS. 8 through 10 are cross-sectional views illustrating intermediate structures of fabricating MOSFETs according to additional embodiments of the present invention.
Figure 11:
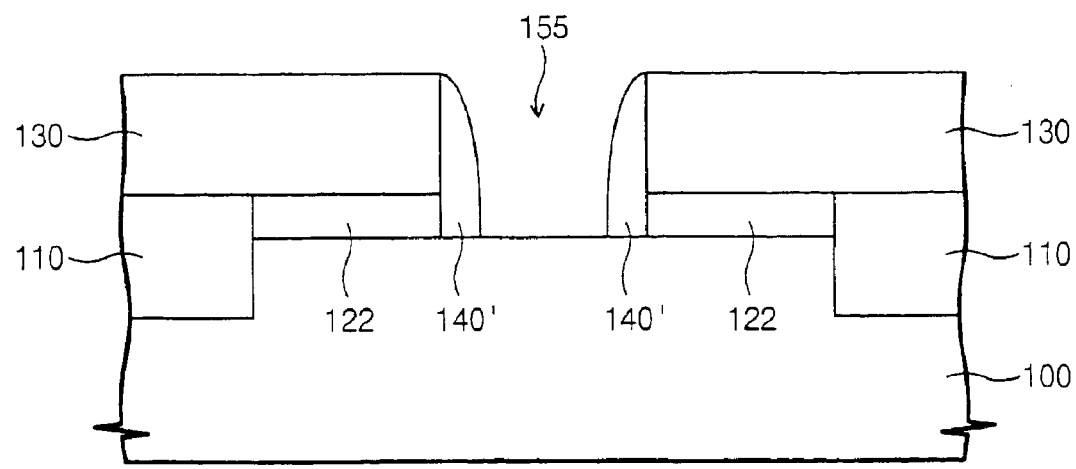
FIGS. 11 through 13 are cross-sectional views illustrating intermediate structures of fabricating MOSFETs according to still additional embodiments of the present invention.

According to modifications of the present invention illustrated in FIG. 8, the groove 152 may be formed using only the mask patterns 130 as an etch mask without the spacers 140. In this case the recessed region may not remain. According to additional modifications illustrated in FIG. 11, spacers 140' may be formed on sidewalls of the gap region 155 formed according to the modification of FIG. 8. In this case, the spacers 140' may be in contact with a top surface of the substrate 100. The recessed region does not remain under the spacers 140'.

In addition, a lightly doped region (not shown) may be further formed in the semiconductor substrate 100 exposed through the groove 152 before the spacers 140' are formed. In this case, after the spacers are formed on portions of the lightly doped region, the exposed portions of lightly doped region may be etched using the spacers and the mask patterns 130 as an etch mask.

Figure 4:
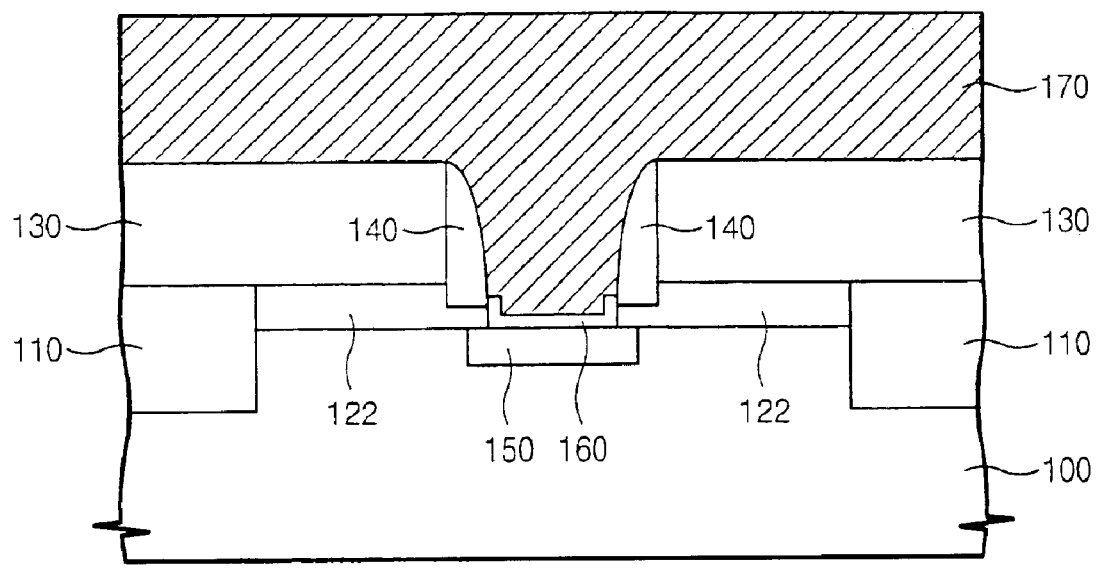

Referring to FIG. 4, a gate insulating layer 160 is formed on a surface of the substrate 100 exposed through the gap region 155 and the source/drain impurity region 122. The gate insulating layer 160 may be a silicon oxide layer formed using a thermal process and the thermal process may be performed at a temperature in the range of approximately 700° C. to approximately 1200° C. Etch damage of the substrate 100 occurring while the groove 152 is formed can be cured by the high temperature thermal oxidation. In addition, the thermal process may contribute to an activation of the impurities in the channel impurity region 150.

A gate conductive layer 170 is formed on an entire surface of the semiconductor substrate including the gate insulating layer 160. The gate conductive layer 170 may be formed of at least one of polysilicon, polysilicon germanium, tungsten, cobalt, titanium, titanium nitride, tantalum, tantalum nitride, aluminum, and/or copper.

Figure 9:
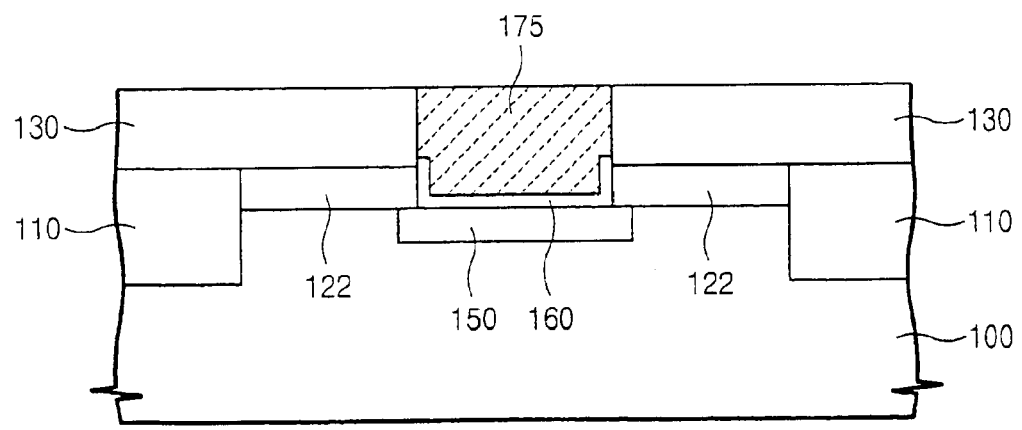
Figure 12:
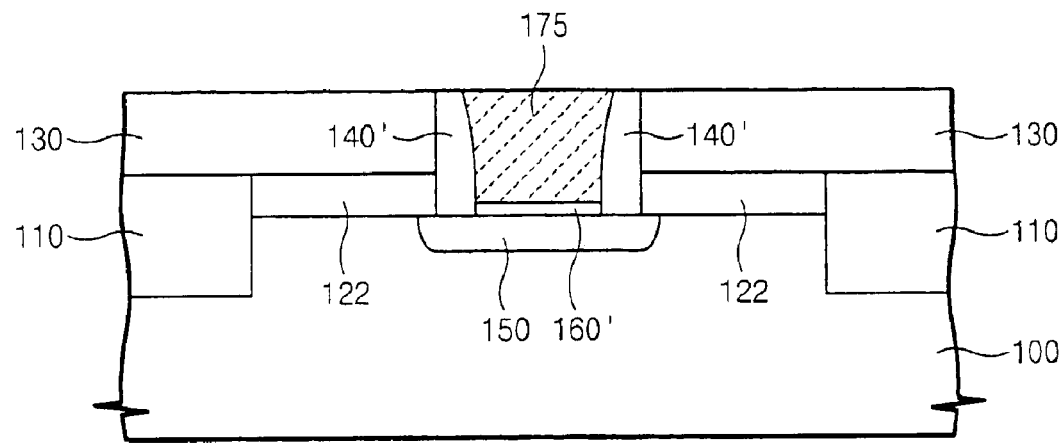

According to modifications of the present invention, the gate insulating layers 160 and 160' and the gate conductive layer 170 of FIGS. 9 and 12 may be formed as described above. The gate insulating layer 160' of FIG. 12 may not be formed on the surface of the source/drain regions 122 because entire sidewalls of the gap region 155 are covered with the spacers 140'.

Figure 5:
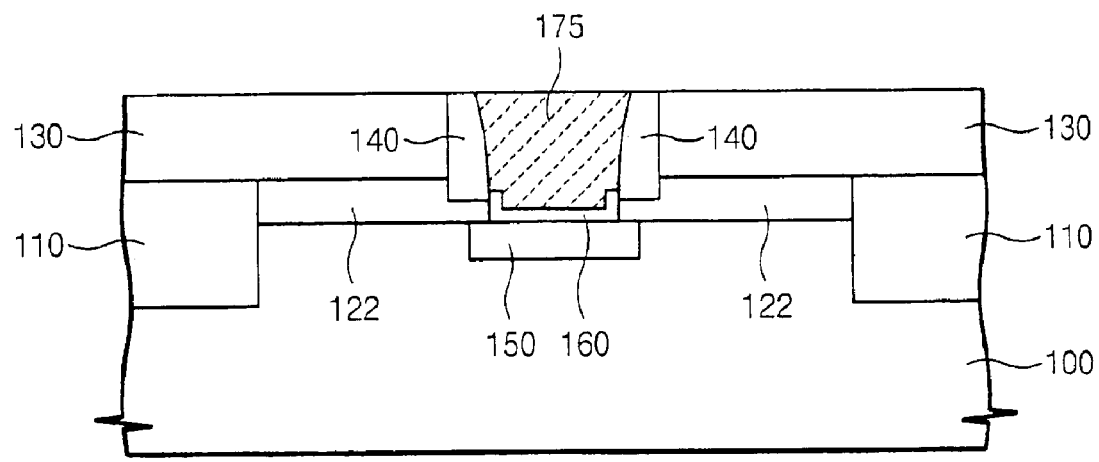

Referring to FIG. 5, the gate conductive layer 170 is planarizingly etched until the mask patterns 130 are exposed, to form a gate conductive pattern 175 filling the gap region 155. The planarizing etching may be carried out using a chemical mechanical polishing (CMP), an etch back, or the like. The gate conductive pattern 175 may serve as a gate electrode of a MOSFET. A planarizing etch process may similarly be performed to form gate conductive patterns 175 filling gap regions 155 of FIGS. 9 and 12.

Consequently, MOSFET, according to embodiments of the present invention may have an elevated source/drain structure. The elevated source/drain structure results from forming the impurity layer 120 on an entire surface of an active region, forming a gap region 155 to cut the impurity layer 120, and forming the gate insulating layer 160 and the gate conductive pattern 175 in the groove 155. An epitaxial process is thus not necessary to form the impurity layer 120 so that cost and/or complexity may be reduced. As illustrated above, for example ion implantation may be used. Methods according to the present invention may thus be implemented more easily than forming elevated source/drain structures using epitaxial growth.

Figure 6:
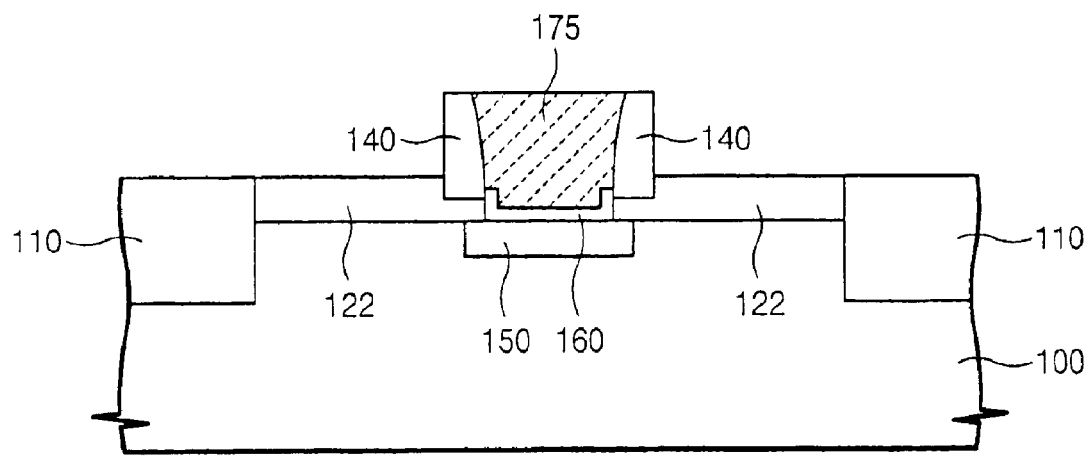
Figure 7:
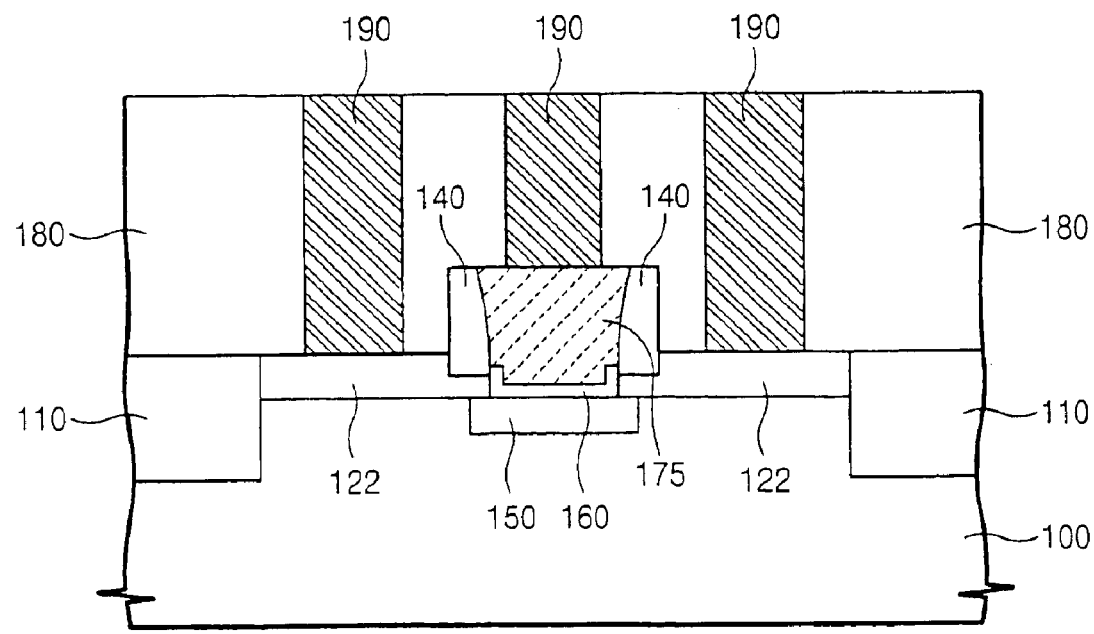

Referring to FIGS. 6 and 7, the mask pattern 130 is removed to expose a top surface of the source/drain impurity region 122, sidewalls of the spacers 140 and a top surface of the device isolating layer 110. The removal process may be performed using an etch recipe having an etch selectivity with respect to the spacers 140 and the gate conductive pattern 175.

An interlayer insulation layer 180 is formed on an entire surface of a resulting structure including the exposed source/drain impurity regions 122. The interlayer insulation layer 180 may be an insulation layer including a silicon oxide layer. The interlayer insulation layer 180 is patterned to form contact holes exposing the source/drain impurity regions 122 and a top surface of the gate conductive pattern 175, respectively. Afterwards, an interconnection conductive layer is formed on interlayer insulation layer 180 including the contact holes. Then, a predetermine node separation process may be performed to form the contact plugs 190 that fill the contact holes.

Figure 10:
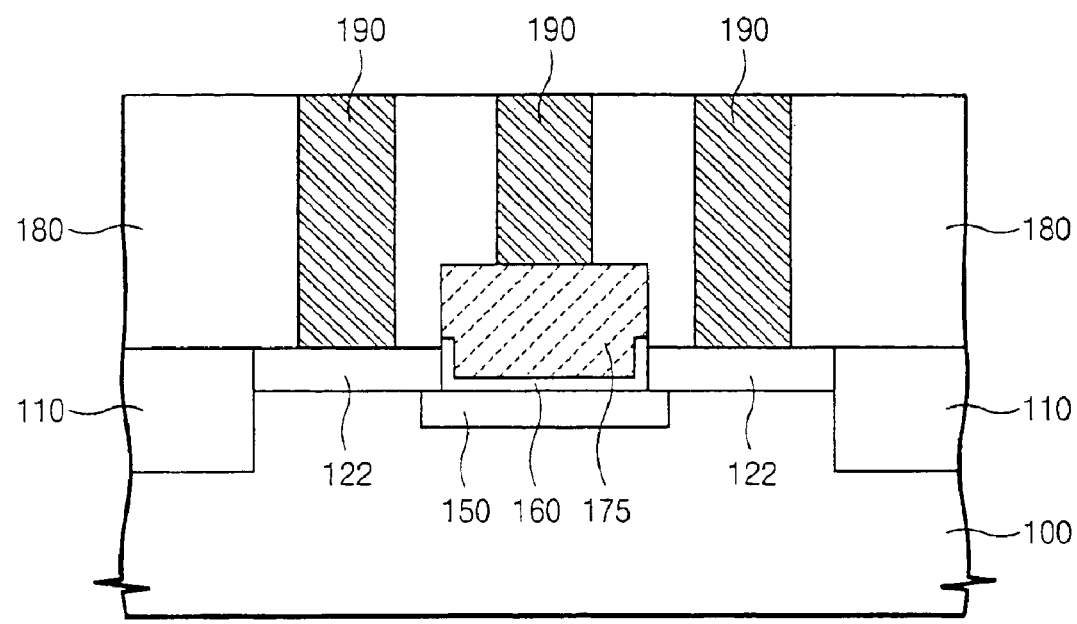
Figure 13:
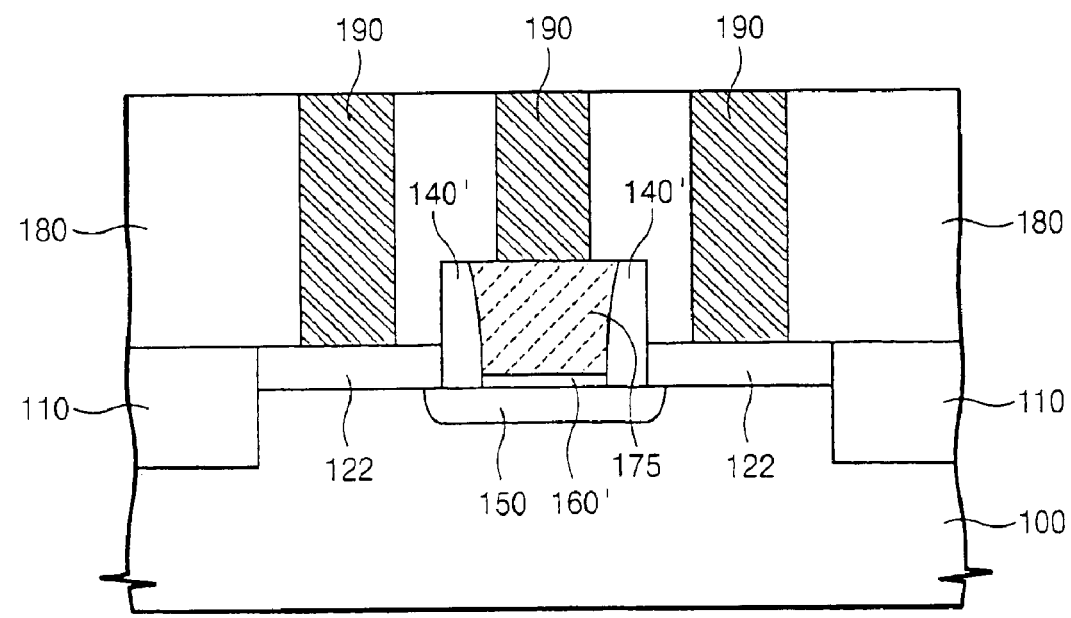
Figure 14:
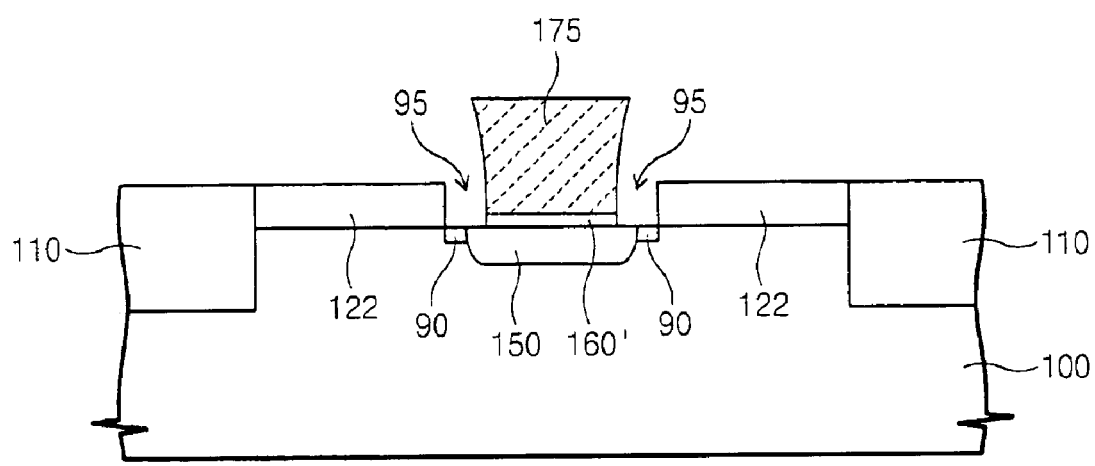
FIGS. 14 through 15 are cross-sectional views illustrating intermediate structures of fabricating MOSFETs according to yet additional embodiments of the present invention.
Figure 15:
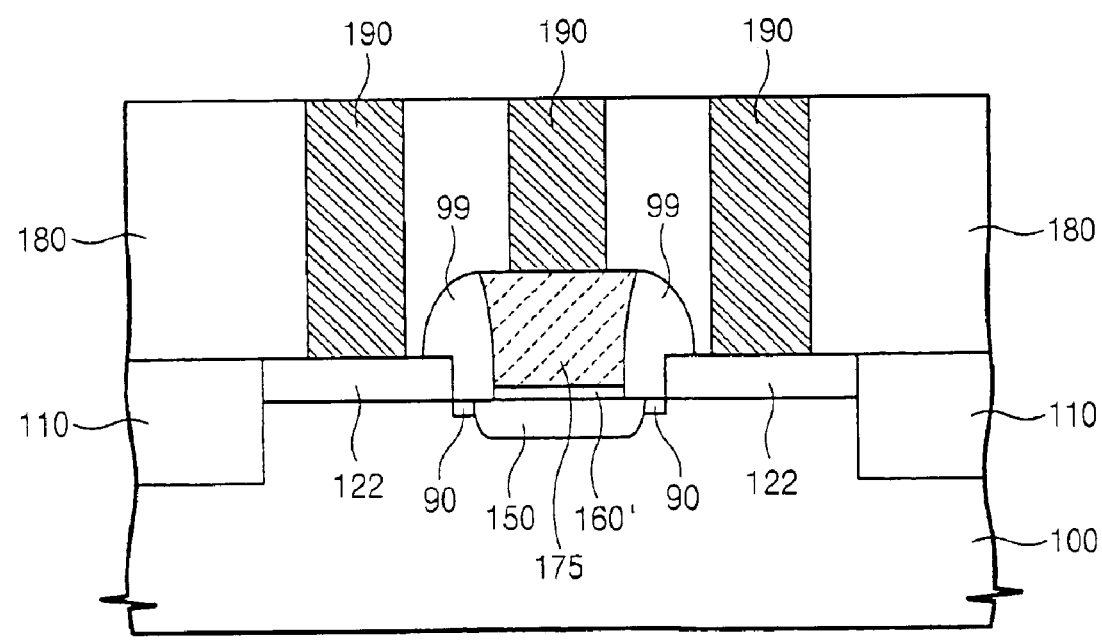

Meanwhile, according to embodiments illustrated in FIGS. 11–15, the spacers 140' may be removed to further form a predetermined opening region 95 between the gate conductive pattern 175 and the source/drain impurity regions 122 after the gate conductive pattern 175 is formed, as shown in FIG. 14. An extended impurity region 90 may be further formed in portions of the semiconductor substrate 100 exposed through the opening regions 95. The extended impurity region 90 has the same conductivity type as the source/drain impurity region 122 and may be formed using an ion implant. In addition, the step of forming the opening region 95 may use an etch recipe having etch selectivity with respect to the gate conductive pattern and the source/drain impurity regions 122. A predetermined insulating layer 99 may be formed to fill the opening regions 95 and then the above explained interlayer insulating layer 180 and interconnection plugs 190 may be formed, as shown in FIG. 15. The insulating layer 99 (separate from the interlayer insulating layer 180) may not be required. In other embodiments, the mask pattern 130 may be maintained and used as the interlayer insulating layer 180. FIGS. 10 and 13 are cross-sectional views showing the resultant structures respectively according to the embodiments illustrated in FIGS. 8–10 and the embodiments illustrated in FIGS. 11–13 including the interconnection plugs 190.

FIGS. 16 through 22 are cross-sectional views illustrating methods of forming MOSFETs according to a yet additional embodiments of the present invention. Explanation corresponding to previously discussed embodiments will not be repeated further.

Figure 16:
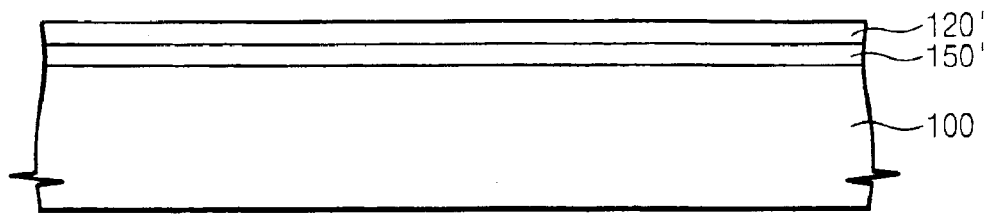
FIGS. 16 through 22 are cross-sectional views illustrating intermediate structures of fabricating MOSFETs according to more embodiments of the present invention.

Referring to FIG. 16, a channel impurity layer 150' and an impurity layer 120' are formed on the semiconductor substrate 100, the layers being sequentially stacked. In FIG. 16, the channel impurity layer 150' and the impurity layer 120' may be formed on an entire surface of one subregion in the substrate 100. In other words, the channel impurity layer 150' and the impurity layer 120' may be formed before forming the device isolating layer.

In some embodiments of the present invention, the channel impurity layer 150' may be formed in the semiconductor substrate using an ion-implantation, and the impurity layer 120' may be formed on the resultant structure thereof. The impurity layer 120' may be formed using at least one of in-situ epitaxial growth, diffusion, and/or ion-implantation.

In other embodiments of the present invention, the channel impurity layer 150' may be formed using ion implantation after the formation of the impurity layer 120'. In this case, the ion implantation for forming the channel impurity layer 150' may be carried out to form a penetration range Rp under a bottom surface of the impurity layer 120'.

Figure 17:
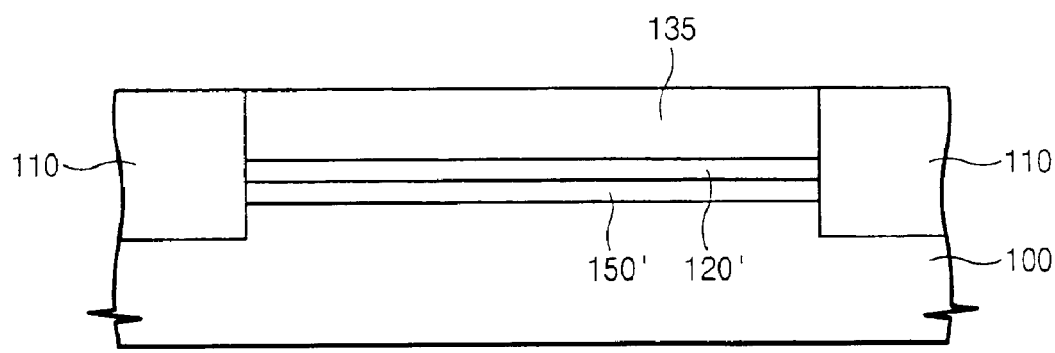

Referring to FIG. 17, a device isolating mask layer is formed on the impurity layer 120'. The device isolating mask layer may be formed of at least one of a silicon nitride layer, a silicon oxide layer, and/or a silicon oxynitride layer. Then, the device isolating mask layer may be patterned to form a device isolating mask pattern 135 defining an active region.

Using the device isolating mask pattern 135 as the etch mask, the impurity layer 120', the channel impurity layer 150' and the semiconductor substrate 100 are successively etched. Therefore, trenches are formed in the bottom region to define a plurality of active regions therebetween. Afterwards, a device isolating layer 110 is formed to fill the trench. The device isolating layer 110 can include at least one of a silicon oxide layer and/or a silicon nitride layer.

Figure 18:
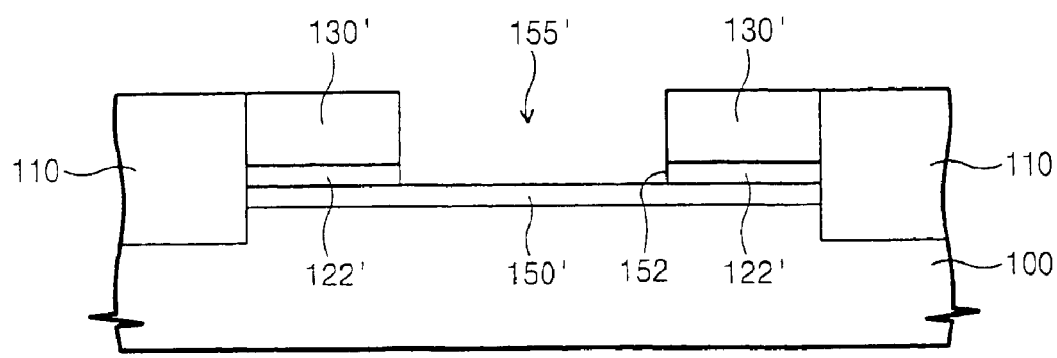

Referring to FIG. 18, the device isolating mask pattern 135 is patterned to form mask pattern 130' serving as a mold pattern in a subsequent process for forming a gate conductive pattern. Using the mask pattern 130' as an etch mask, the impurity layer 120' is etched to form grooves 152 that define source/drain impurity regions 122'. The groove 152 crosses over the active region and exposes portions of the channel impurity layer 150'. A space surrounded by the groove 152 and the mask pattern 130' defines a gap region 155 where a gate conductive pattern is formed.

Figure 19:
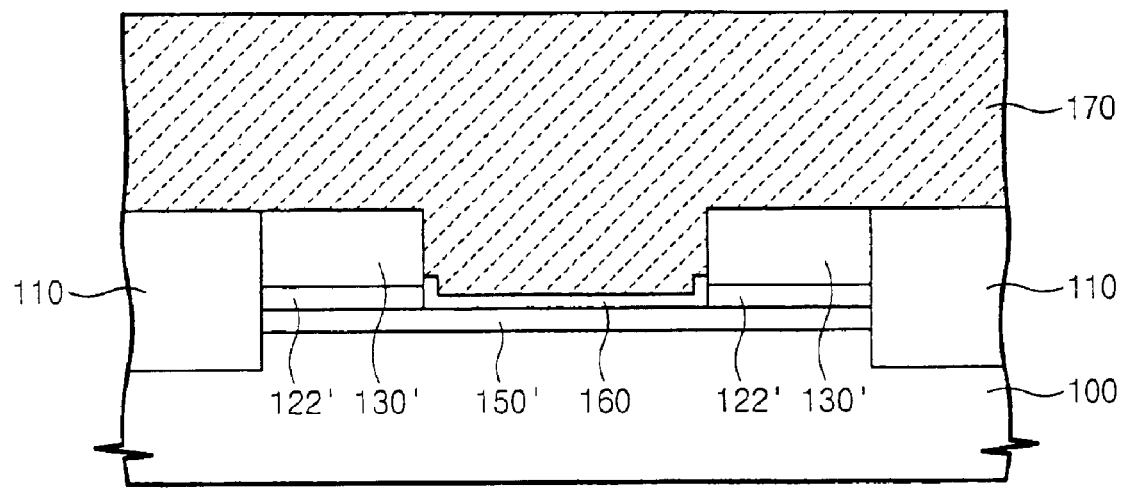
Figure 20:
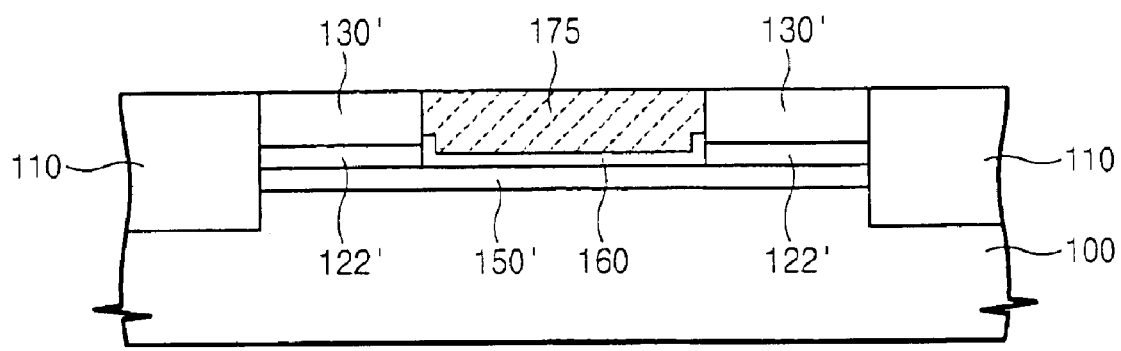

Referring to FIGS. 19 and 20, a gate insulating layer 160 is formed on the exposed channel impurity layer 150', and a gate conductive layer 170 is formed on an entire surface of the structure including the gate insulating layer 160. The gate conductive pattern 170 is planarizingly etched until the mask pattern 130' is exposed to form a gate conductive pattern 175 that fills the gap region 155.

Figure 21:
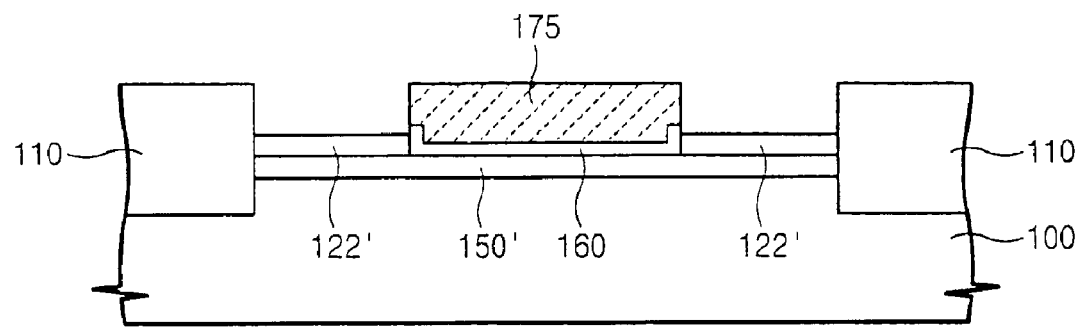
Figure 22:
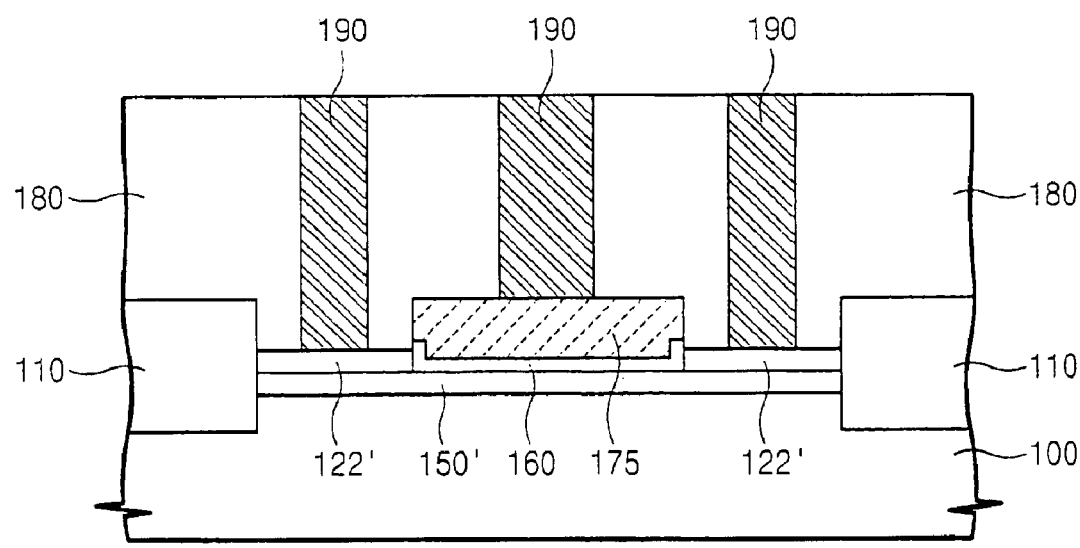

Referring to FIGS. 21 and 22, the exposed mask pattern 130' is removed to expose the source/drain impurity regions 122and then an interlayer insulating layer 180 and interconnection plugs 190 are formed on the resultant structure. The interlayer insulating layer 180 and the interconnection plugs 190 are formed in the same manner as discussed above with respect to FIGS. 7, 10, and 13.

According to embodiments of the present invention, an impurity layer is formed on an entire surface of a semiconductor substrate a gap is formed in the impurity layer, and a gate conductive pattern is formed in the gap in the impurity layer. Therefore, the divided impurity layer provides elevated source/drain structure. In addition, the elevated source/drain structures reduce penetration of the impurities in the source/drain impurity regions into the channel region. Therefore, short channel effects can be reduced.

In addition, after the impurity layer is formed, a thermal treatment can be efficiently performed with loosened limitation regarding process conditions. Therefore, impurities in the impurity layer can be activated and lattice defects can be effectively cured. Accordingly, electrically well-characterized MOSFETs can be fabricated with reduced complexity and/or cost.

While the present invention has been described by way of example and in terms of the particular embodiments, it is to be understood that the invention is not limited to the disclosed embodiments. To the contrary, it is intended to cover various modifications and similar arrangements would be apparent to those skilled in the art. Therefore, the scope of the appended claims, which define the invention, should be accorded the broadest interpretation so as to encompass all such modifications and similar structures.

What is claimed is:

1. A method of forming a field effect transistor, the method comprising:
   forming a doped channel region at a surface of the semiconductor substrate;
   after forming the doped channel region at a surface of the semiconductor substrate, forming a doped layer at a surface of a semiconductor substrate, wherein forming the doped layer comprises forming the doped layer on the doped channel region;
   forming a groove through the doped layer at the surface of the semiconductor substrate while maintaining portions of the doped layer on opposite sides of the groove;
   after forming the groove through the doped layer, forming a gate insulating layer on a surface of the groove; and
   forming a gate electrode on the gate insulating layer in the groove.

2. A method according to claim 1 further comprising:
   before forming the groove, forming a mask on the doped layer wherein a gap in the mask exposes portions of the doped layer and wherein forming the groove comprises etching the exposed portions of the doped layer.

3. A method according to claim 2 wherein forming the mask comprises:
   forming a layer of a mask material on the doped layer; and
   patterning the layer of the mask material to expose portions of the doped layer.

4. A method according to claim 3 wherein the mask material comprises at least one of silicon oxide, silicon nitride, silicon oxynitride, and/or silicon carbide.

5. A method according to claim 2 further comprising:
   before forming the groove, forming insulating spacers on sidewalls of the gap in the mask.

6. A method according to claim 5 further comprising:
   after forming the groove, the gate insulating layer, and the gate electrode, removing the insulating spacers; and
   after removing the insulating spacers, forming doped regions in the groove adjacent the gate insulating layer.

7. A method according to claim 6 wherein removing the insulating spacers comprises etching the spacers using an etch chemistry that etches the insulating spacers selectively with respect to the gate electrode.

8. A method according to claim 6 wherein forming the doped regions comprises ion implanting dopants having a same conductivity type as the doped layer.

9. A method according to claim 2 wherein forming the gate electrode comprises forming the gate electrode on the gate insulating layer in the groove and in the gap in the mask.

10. A method according to claim 1 further comprising:
    forming isolation layers on the surface of the semiconductor substrate defining an active region therebetween wherein the doped layer extends across an entirety of the active region prior to forming the groove.

11. A method according to claim 1 wherein forming the doped layer comprises at least one of diffusing dopants into the doped layer, ion implanting dopants into the doped layer, and/or in-situ epitaxial growth of the doped layer.

12. A method according to claim 1 wherein forming the groove comprises:
    forming a mask on the doped layer wherein a gap in the mask exposes portions of the doped layer;
    recessing exposed portions of the doped layer to a depth less than a depth of the doped layer;
    after recessing exposed portions of the doped layer to a depth less than a depth of the doped layer, forming insulating spacers on sidewalls of the gap in the mask and on sidewalls of the recessed portions of the doped layer; and
    after forming the insulating spacers, etching portions of the doped layer between the insulating spacers.

13. A method according to claim 1 wherein forming the groove comprises:
    forming a mask on the doped layer wherein a gap in the mask exposes portions of the doped layer;
    etching through exposed portions of the doped layer;
    after etching through exposed portions of the doped layer, forming a lightly doped region in the substrate exposed through the mask;
    forming insulating spacers on sidewalls of a gap in the mask and on sidewalls of the doped layer; and
    etching portions of the lightly doped region exposed through the mask and spacers.

14. A method according to claim 1 further comprising:
    before forming the gate insulating layer, forming a doped channel region in a portion of the substrate exposed through the groove.

15. A method according to claim 14 wherein portions of the semiconductor substrate adjacent the doped layer have a conductivity type different than a conductivity type of the doped layer, and wherein the portions of the semiconductor substrate adjacent the doped layer have a conductivity type that is the same as a conductivity type of the doped channel region.

16. A method according to claim 14 wherein forming the doped channel region comprises at least one of diffusing dopants into the doped channel region, ion implanting dopants into the doped channel region, and/or in-situ epitaxial growth of the doped channel region.

17. A method according to claim 1 wherein forming the gate insulating layer comprises thermally oxidizing a surface of the groove at a temperature in the range of approximately 700° C. to approximately 1200° C.

18. A method according to claim 1 further comprising:
    before forming the groove, forming a mask on the doped layer wherein a gap in the mask exposes portions of the doped layer;
    wherein forming the groove comprises etching the exposed portions of the doped layer; and
    wherein forming the gate electrode comprises forming a conductive layer on the mask, in the gap in the mask, and on the exposed portions of the doped layer, and removing portions of the conductive layer on the mask while maintaining portions of the conductive layer in the gap and on the exposed portions of the doped layer.

19. A method according to claim 18 wherein the conductive layer comprises at least one of polysilicon, polysilicon germanium, tungsten, cobalt, titanium, titanium nitride, tantalum, tantalum nitride, aluminum, and/or copper.

20. A method according to claim 18 further comprising:
after removing portions of the conductive layer on the mask, removing the mask.

21. A method of forming a field effect transistor, the method comprising:
forming a doped layer at a surface of a semiconductor substrate wherein forming the doped layer comprises ion implanting dopants into the doped layer at a plurality of different energies;
forming a groove through the doped layer at the surface of the semiconductor substrate while maintaining portions of the doped layer on opposite sides of the groove;
after forming the groove through the doped layer, forming a gate insulating layer on a surface of the groove; and
forming a gate electrode on the gate insulating layer in the groove.

22. A method according to claim 21 wherein the doped layer has a relatively uniform dopant concentration throughout a depth thereof.

23. A method according to claim 21 further comprising:
before forming the doped layer, forming a doped channel region at a surface of the semiconductor substrate, wherein forming the doped layer comprises forming the doped layer on the doped channel region.

24. A method according to claim 23 wherein forming the doped layer comprises forming the doped layer using epitaxial deposition on the doped channel region.

25. A method of forming a field effect transistor, the method comprising:
forming a doped layer at a surface of a semiconductor substrate;
forming a groove through the doped layer at the surface of the semiconductor substrate while maintaining portions of the doped layer on opposite sides of the groove wherein forming the groove comprises,
forming a mask on the doped layer wherein a gap in the mask exposes portions of the doped layer,
recessing exposed portions of the doped layer to a depth less than a death of the doped layer wherein recessing the exposed portions of the doped layer comprises recessing the exposed portions of the doped layer to a depth of greatest dopant concentrations.
after recessing exposed portions of the doped layer to a depth less than a depth of the doped layer, forming insulating spacers on sidewalls of the gap in the mask and on sidewalls of the recessed portions of the doped layer, and
after forming the insulating spacers, etching portions of the doped layer between the insulating spacers;
after forming the groove through the doped layer, forming a gate insulating layer on a surface of the groove; and
forming a gate electrode on the gate insulating layer in the groove.

26. A method of forming a field effect transistor, the method comprising:
forming a doped layer at a surface of a semiconductor substrate;
after forming the doped layer, forming an active region mask on portions of the doped layer;
forming device isolation trenches in portions of the doped layer and semiconductor substrate exposed by the active region mask;
forming isolating layers in the device isolation trenches;
forming a groove through the doped layer at the surface of the semiconductor substrate while maintaining portions of the doped layer on opposite sides of the groove;
after forming the groove through the doped layer, forming a gate insulating layer on a surface of the groove; and
forming a gate electrode on the gate insulating layer in the groove.

27. A method according to claim 26 further comprising:
forming a gap in the active region mask exposing portions of the doped layer between isolating layers, wherein forming the groove comprises etching portions of the doped layer exposed through the gap in the mask.

* * * * *